(12) United States Patent
Farber et al.

(10) Patent No.: US 6,405,399 B1
(45) Date of Patent: Jun. 18, 2002

(54) METHOD AND SYSTEM OF CLEANING A WAFER AFTER CHEMICAL MECHANICAL POLISHING OR PLASMA PROCESSING

(75) Inventors: Jeffrey J. Farber, Delmar, NY (US); Julia S. Svirchevski, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/344,671

(22) Filed: Jun. 25, 1999

(51) Int. Cl.$^7$ .................................................. B08B 3/02
(52) U.S. Cl. ........................ 15/77; 15/77; 15/88.3; 134/64 R; 134/122 R; 134/172; 134/902
(58) Field of Search .................... 134/64 R, 88, 134/72, 122 R, 172, 902; 15/77, 88.3

(56) References Cited

U.S. PATENT DOCUMENTS

| | | | |
|---|---|---|---|
| 2,651,065 A | * 9/1953 | O'Connor | 13/64 R |
| 3,630,213 A | * 12/1971 | Bruno et al. | |
| 3,793,054 A | * 2/1974 | Franz | |
| 4,027,686 A | 6/1977 | Shortes et al. | |
| 4,062,463 A | 12/1977 | Hillman et al. | 214/301 |
| 4,202,071 A | 5/1980 | Scharpf | 15/302 |
| 4,382,308 A | 5/1983 | Curcio | 15/77 |
| 4,724,856 A | * 2/1988 | Pender | |
| 5,129,955 A | 7/1992 | Tanaka | 134/2 |
| 5,209,028 A | * 5/1993 | McDermott et al. | |
| 5,264,036 A | * 11/1993 | Haas et al. | |
| 5,311,893 A | 5/1994 | Nishi | |
| 5,317,778 A | 6/1994 | Kudo et al. | 15/88.3 |
| 5,357,645 A | 10/1994 | Onodera | 15/97.1 |
| 5,361,449 A | 11/1994 | Akimoto | 15/302 |
| 5,486,134 A | 1/1996 | Jones et al. | 451/209 |
| 5,490,809 A | 2/1996 | Jones et al. | 451/60 |
| 5,581,837 A | 12/1996 | Uchiyama et al. | 15/77 |
| 5,624,501 A | 4/1997 | Gill, Jr. | 134/6 |
| 5,634,980 A | * 6/1997 | Tomita et al. | |
| 5,639,311 A | 6/1997 | Holly et al. | 134/6 |
| 5,651,160 A | 7/1997 | Yonemizu et al. | 15/302 |
| 5,675,856 A | 10/1997 | Itzkowitz | 15/77 |
| 5,693,148 A | 12/1997 | Simmons et al. | 134/18 |
| 5,733,376 A | * 3/1998 | Costello | |
| 5,778,554 A | 7/1998 | Jones | 34/58 |
| 5,782,987 A | * 7/1998 | Furman | |
| 5,806,126 A | 9/1998 | de Larios et al. | 15/102 |
| 5,875,507 A | 3/1999 | Stephens et al. | 15/102 |
| 5,924,154 A | * 7/1999 | Gockel | |
| 5,975,098 A | 11/1999 | Yoshitani et al. | |
| 6,070,600 A | * 6/2000 | Grootegoed et al. | |
| 6,280,299 B1 | * 8/2001 | Kennedy et al. | |

FOREIGN PATENT DOCUMENTS

| | | | |
|---|---|---|---|
| EP | 63-4617 | 9/1988 | H01L/21/304 |
| FR | 95 08510 | 7/1995 | C23G/1/14 |
| JP | 57-114225 | 7/1982 | |
| JP | 63-174324 | * 7/1988 | 134/902 |
| JP | 3-274722 | * 12/1991 | |
| JP | 4-71232 | * 3/1992 | |
| JP | 4-133491 | * 5/1992 | |
| JP | 4-199713 | * 7/1992 | |
| JP | 5-136109 | * 6/1993 | |
| JP | 6-120192 | * 4/1994 | 134/902 |
| JP | 9-171986 | 6/1997 | |
| WO | WO 97/13590 | 4/1997 | B08B/11/00 |
| WO | WO 98/08418 | 3/1998 | |
| WO | WO 99/22908 | 5/1999 | B24B/37/04 |

* cited by examiner

Primary Examiner—Frankie L. Stinson
(74) Attorney, Agent, or Firm—Martine & Penilla, LLP

(57) ABSTRACT

A method and system are provided for cleaning a surface of a semiconductor wafer following a fabrication operation. The system includes a brush box, which has a fluid manifold and at least one nozzle. The nozzle is connected to the fluid manifold by a flexible conduit. The nozzle is configured to spray a liquid onto the surface of the wafer at an application angle and at a fan angle. The application angle is defined between a plane of the surface of the wafer and a spraying plane of the liquid. The fan angle and the application angle are configured such that the spraying liquid covers the surface of the wafer in a quiescent manner.

17 Claims, 8 Drawing Sheets

METHOD AND SYSTEM OF CLEANING A WAFER AFTER CHEMICAL MECHANICAL POLISHING OR PLASMA PROCESSING

BACKGROUND OF THE INVENTION

1. Field of the Invention

The present invention relates to semiconductor wafer cleaning and, more particularly, to techniques for more safely applying a rinsing liquid to the surface of a semiconductor wafer after a fabrication operation.

2. Description of the Related Art

In the semiconductor chip fabrication process, it is well-known that there is a need to clean the surface of the wafer after fabrication operations that leave unwanted residues or organic contaminants on the surface of the wafer. Examples of such fabrication operations include plasma etching (e.g., tungsten etch back (WEB)) and chemical mechanical polishing (CMP).

If left on the surface of the wafer for subsequent fabrication operations, unwanted residual material and organic contaminants may cause inappropriate interactions between metallization features. In some cases, such defects may cause devices on the wafer to become inoperable. In order to avoid the undue costs of discarding wafers having inoperable devices, it is necessary to clean the wafer adequately yet efficiently after fabrication operations that leave unwanted residue and contaminants on the surface of the wafer.

FIG. 1 shows a high-level schematic diagram of a wafer cleaning system 50. The cleaning system 50 typically includes a load station 10 where a plurality of wafers in a cassette 14 may be inserted for cleaning through the system. Once the wafers are inserted into the load station 10, a wafer 12 may be taken from the cassette 14 and moved into a brush box one 16*a*, where the wafer 12 is scrubbed with selected chemicals and water (e.g., DI water). The wafer 12 is then moved to a brush box two 16*b*. After the wafer has been scrubbed in the brush boxes 16, the wafer is moved into a spin, rinse, and dry (SRD) station 20 where de-ionized water is sprayed onto the surface of the wafer while the wafer is spun at a speed of between about 100 and 400 revolutions per minute, and then is spun to dry. After the wafer has been placed through the SRD station 20, the wafer is moved to an unload station 22.

By way of example, when the wafer 12 enters the cleaning system 50, the wafer 12 enters the cassette 14 and may be sprayed with water while in the cassette in order to wet the surface. Alternatively, the wafer can be sprayed with water as the wafer 12 enters brush box one 16*a* or brush box two 16*b*. Unfortunately, in such water spraying operations, the application of water tends to be non-uniform in that portions of the wafer may receive the application of water before other portions. The portions of the wafer that are sprayed initially will likely undergo unwanted reactions with the chemicals that were on the wafer 12 after the WEB operation. Although the spraying operation may saturate the entire surface of wafer 12, the initial droplets that are applied to the wafer surface will necessarily cause the wafer to have portions of stained surface and portions of non-stained surface. Furthermore, in addition to stains, the technique of spraying water may cause micro-scratches on the surface of the wafer.

Unwanted stains or micro-scratches on the wafer surface may cause, among other things, inappropriate reactions between metallization features. These reactions may destroy the operability of devices on the wafer. A wafer with stains or micro-scratches typically must be discarded, which will ultimately add substantial cost to the overall fabrication process. Unfortunately, the stains or micro-scratches on the surface generally cannot be removed in subsequent cleaning or fabrication operations.

In order to avoid formation of unwanted stains and micro-scratches or introduce other unwanted chemicals onto the wafer surface, some manufacturers will use an additional step by processing the wafer through an SRD station before sending the wafer to the scrubber of brush box one 16*a*. However, this SRD station will have to be an application specific unit, which will necessarily add significant costs to the construction of a cleaning system 50. Not only does this add significant costs to the station, standard SRD stations are not well configured to perform the pre-cleaning of the wafer surface. The reason standard SRD stations are not well configured is because an SRD station applies a non-controlled spray of water or chemicals over the wafer surface while the wafer is rotated at high speeds. Thus, the incorporation of this additional application specific SRD station will, in most cases, still cause micro-scratching and stains. In view of the foregoing, there is a need for a cleaning process that avoids the problems of the prior art by implementing wafer rinsing techniques for efficiently avoiding the formation of unwanted stains and micro-scratches.

SUMMARY OF THE INVENTION

Broadly speaking, the present invention fills these needs by providing a method and system for more safely applying liquid to a surface of a semiconductor wafer. It should be appreciated that the present invention can be implemented in numerous ways, including as a process, an apparatus, a system, a device or a method. Several inventive embodiments of the present invention are described below.

In one embodiment, a system is provided for cleaning a surface of a wafer following a fabrication operation. The system comprises a brush box, which includes a fluid manifold and at least one nozzle. The nozzle is connected to the fluid manifold by a flexible conduit. The nozzle is configured to spray a liquid onto the surface of the wafer at an application angle and at a fan angle. The application angle is defined between a plane of the surface of the wafer and a spraying plane of the liquid. The fan angle and the application angle are configured such that the spraying liquid covers the surface of the wafer in a quiescent manner.

In another embodiment, a method is provided for cleaning a surface of a wafer following a fabrication operation. The method comprises transferring the wafer into a cleaning unit and spraying a fan of liquid onto the surface of the wafer as the wafer is being transferred into the cleaning unit. The fan of liquid is applied at an application angle. The application angle is defined between a plane of the surface of the wafer and a plane of the fan of liquid. The fan of liquid is adjusted to be sprayed onto the surface of the wafer at a fan angle. The fan angle and the application are configured such that the spraying liquid covers the surface of the wafer in a quiescent manner.

In yet another embodiment, a wafer spraying apparatus is provided. The wafer spraying apparatus comprises a manifold for delivering a flow of liquid, a flexible conduit connected to the manifold, and a nozzle. The nozzle is connected to a distal end of the flexible conduit. The flexible conduit is configured to transport the flow of liquid from the manifold to the nozzle. The nozzle is configured to spray a fan of the flow of liquid onto the surface of the wafer. The fan of the flow of liquid is applied at an application angle defined between a plane of the fan of the flow of liquid and a surface of the wafer that is configured to receive the flow of liquid from the nozzle. The nozzle is positioned above the surface of the wafer at a nozzle height. The nozzle height and the application angle are adjustable by way of the flexible conduit.

Advantageously, the present invention provides methods and systems for applying liquid to the surface of a wafer by using a quiescent and symmetrical application technique. As a result, where a wafer has undergone a fabrication operation, the applied liquid will not undergo unwanted reactions with residual chemicals on the wafer surface. In addition to substantially eliminating stains, the techniques of the present invention substantially reduce the number of micro-scratches that may be formed on the wafer surface during cleaning operations. The methods of the present invention are particularly beneficial in post-plasma etching and post-CMP cleaning operations, whereby the wafers are sprayed using the spraying apparatus before commencing normal brush box cleaning.

In addition to protecting from formation of stains and micro-scratches, the spraying technique of the present invention is also suitable for changing a hydrophobic wafer surface into a hydrophilic wafer surface, if desired. Also, the spraying technique eliminates additional application specific mandatory spin, rinse, and dry (SRD) steps prior to brush cleaning in a brush box. Other advantages include improved overall post-CMP and post-WEB clean process flow throughput. Ultimately, the methods and systems disclosed herein will substantially reduce undue costs in the overall fabrication process because the number of damaged wafers that must be discarded will be substantially reduced.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

An invention for methods and systems for safely cleaning a surface of a semiconductor wafer after chemical mechanical polishing (CMP) or plasma processing are disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
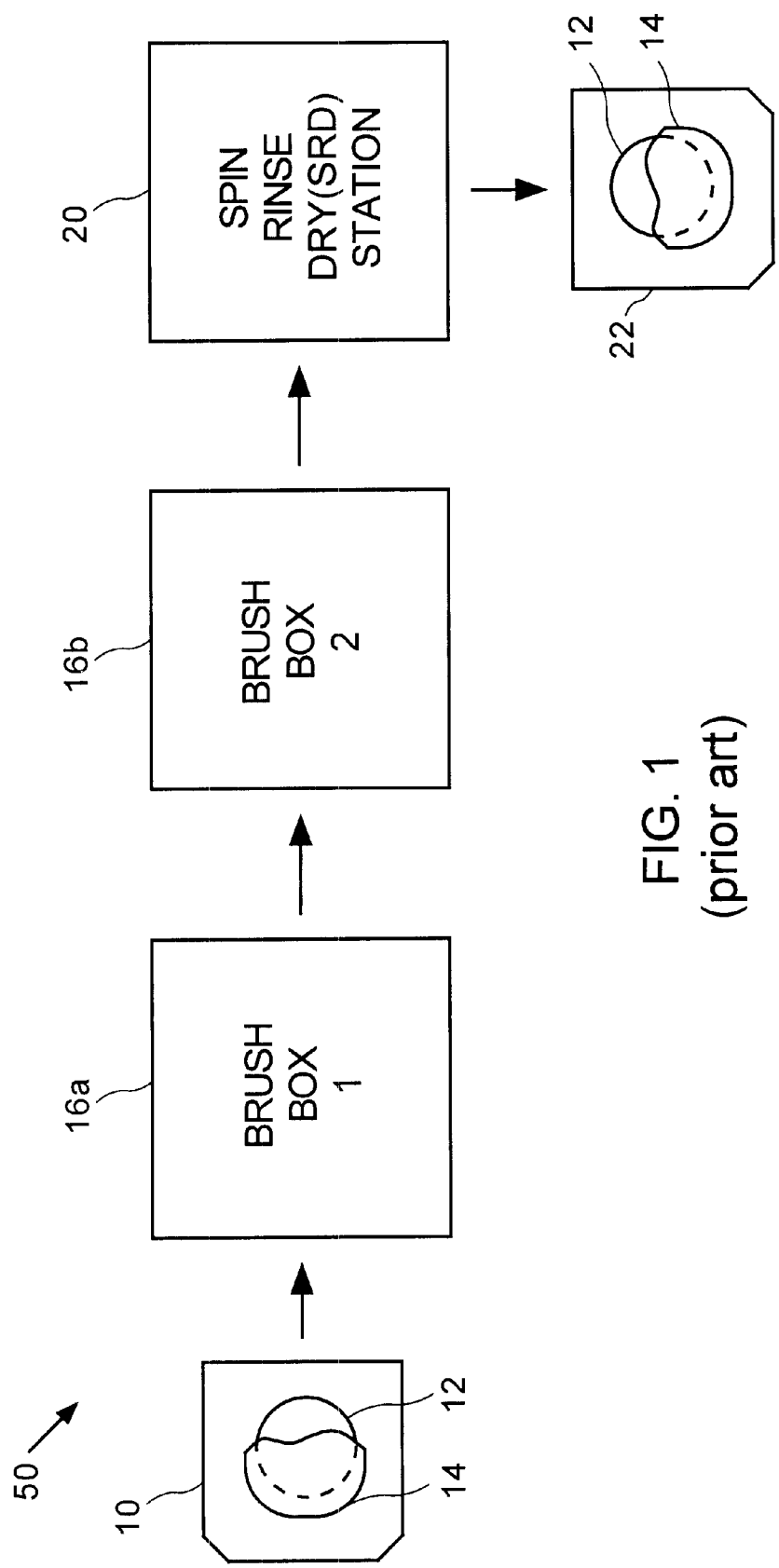
FIG. 1 shows a high-level schematic diagram of a wafer cleaning system.
Figure 2A:
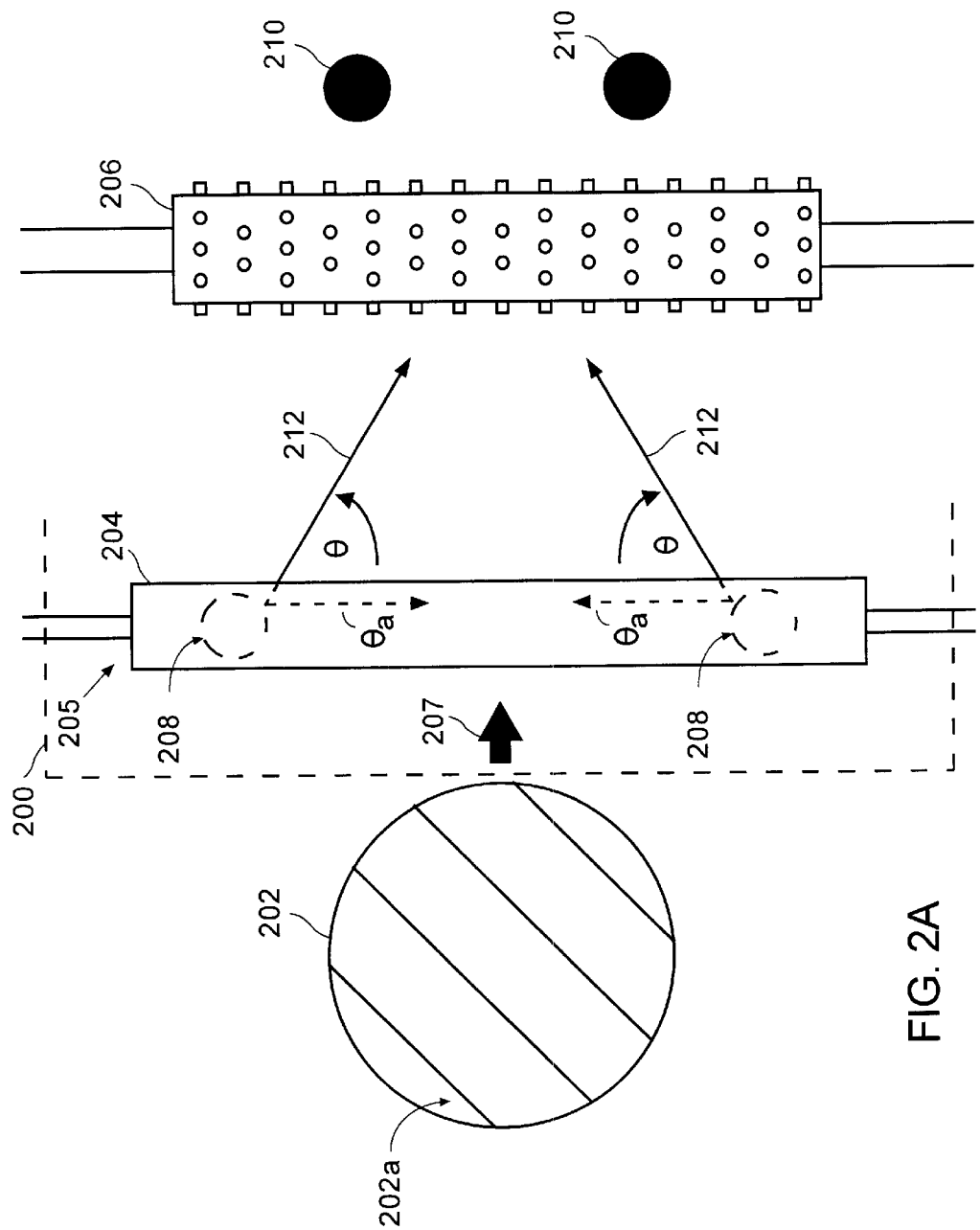
FIG. 2A shows a system of cleaning a wafer using a spraying apparatus, where a wafer has not yet passed under the spraying apparatus, in accordance with one embodiment of the present invention.

FIG. 2A shows a system of cleaning a wafer using a spraying apparatus 205, where a wafer has not yet passed under the spraying apparatus 205, in accordance with one embodiment of the present invention. Before the wafer enters the brush box 200, the wafer may undergo a number of different fabrication operations, such as chemical mechanical polishing (CMP) or plasma etching (e.g., tungsten etch back). It is important to properly prepare the surface of the wafer before the wafer reaches the wafer rollers 210 and is scrubbed with a cleaning brush 206. Unwanted materials or organic contaminants that may be left of the surface of the wafer during the aforementioned fabrication operations may cause damage to the wafer as the wafer undergoes further cleaning operations.

In addition to removing unwanted residues or organic contaminants, it may be desirable to convert the wafer surface 202a from being hydrophobic to being hydrophilic. Converting the surface characteristic of the wafer to hydrophilic allows, among other things, subsequent application of water without causing beading and permanent stains on the wafer surface 202a. The following discussion of FIG. 2 provides techniques for efficiently preparing the surface of the wafer after fabrication operations and before further wafer cleaning operations.

The wafer 202 begins to enter the brush box 200 and moves in a transfer direction 207 towards the cleaning brush 206. Near the entrance of the brush box 200, the spraying apparatus 205 is positioned above the wafer 202. Generally, the spraying apparatus 205 is intended to provide a spray of liquid 212 onto the wafer surface 202a. The spraying apparatus 205 includes a fluid manifold 204 and spray nozzles 208 that are positioned on the bottom portion of the fluid manifold 204. A more detailed discussion of the mechanical structure of the spraying apparatus 205 is provided below with reference to FIG. 4.

The spray nozzles spray a liquid 212 onto the wafer surface 202a as the wafer 202 passes under the spraying apparatus 205 in the transfer direction 207. The transfer rate of the wafer is preferably between about 5 mm/second and about 10 mm/second. The nozzles 208 are positioned to spray the liquid 212 at a fan angle θ, which has an angle starting reference θa. The angle starting reference θa is preferably aligned to be parallel with the fluid manifold 204. The fan angle θ is preferably between about 10 degrees and about 120 degrees, and most preferably about 60 degrees.

The nozzles 208 are preferably aligned such that the liquid 212 exits the nozzles 208 and saturates the wafer surface 202a in a quiescent and symmetrical manner. "Quiescent" means that the liquid 212 is sprayed onto the wafer surface 202a calmly and with substantially no splashing. The substantially no splashing is achieved by ensuring that the flow rate of the spray coming from the nozzles is not too high. Preferably, the combined flow rate for both nozzles 208 should be controlled to not be more than about 775 ml/minute ±20 ml/minute. "Symmetrical" means that the angle starting references θa are substantially the same for the nozzles 208, and the fan angles θ are substantially the same for the nozzles. FIG. 2A shows a preferred embodiment with the fluid manifold 204 having two nozzles 208. In alternative embodiments, however, more or fewer nozzles 208 may be positioned on the fluid manifold 204, preferably as long as the nozzles 208 are positioned to spray liquid 212 onto the wafer surface 202a in a symmetrical and quiescent manner.

The selection of the chemical composition of the liquid 212 depends on a number of factors, including preceding fabrication operations, the unwanted materials on the wafer surface 202a, and the desired effect of the spraying liquid 212. For example, where a CMP operation has been performed on the wafer surface, a suitable chemical composition of the liquid may be de-ionized water. De-ionized water is particularly suited for removing certain unwanted residual material on the wafer surface 202a after a CMP operation or a tungsten etch back (WEB) operation.

In other applications, the liquid 212 may be standard clean one (SC-1), which includes $NH_4OH$, $H_2O_2$, and de-ionized (DI) water, where the volumetric ratio of $NH_4OH:H_2O_2:DI$ water is about 1:4:20. SC-1 is useful for converting the wafer surface 202a from being hydrophobic to being hydrophilic, or for removing organic contaminants. SC-1 is mainly used for cleaning silicon surfaces. Yet another liquid is a surfactant to remove residues, lower surface tension, increase wettability, and clean the wafer surface. Surfactants are preferably used for cleaning a silicon surface after a CMP operation. Still another liquid is a "perania" solution, which consists of $H_2SO_4$, $H_2$, and DI water. A perania solution is preferably used to remove organic contaminants and to clean a silicon surface.

Figure 2B:
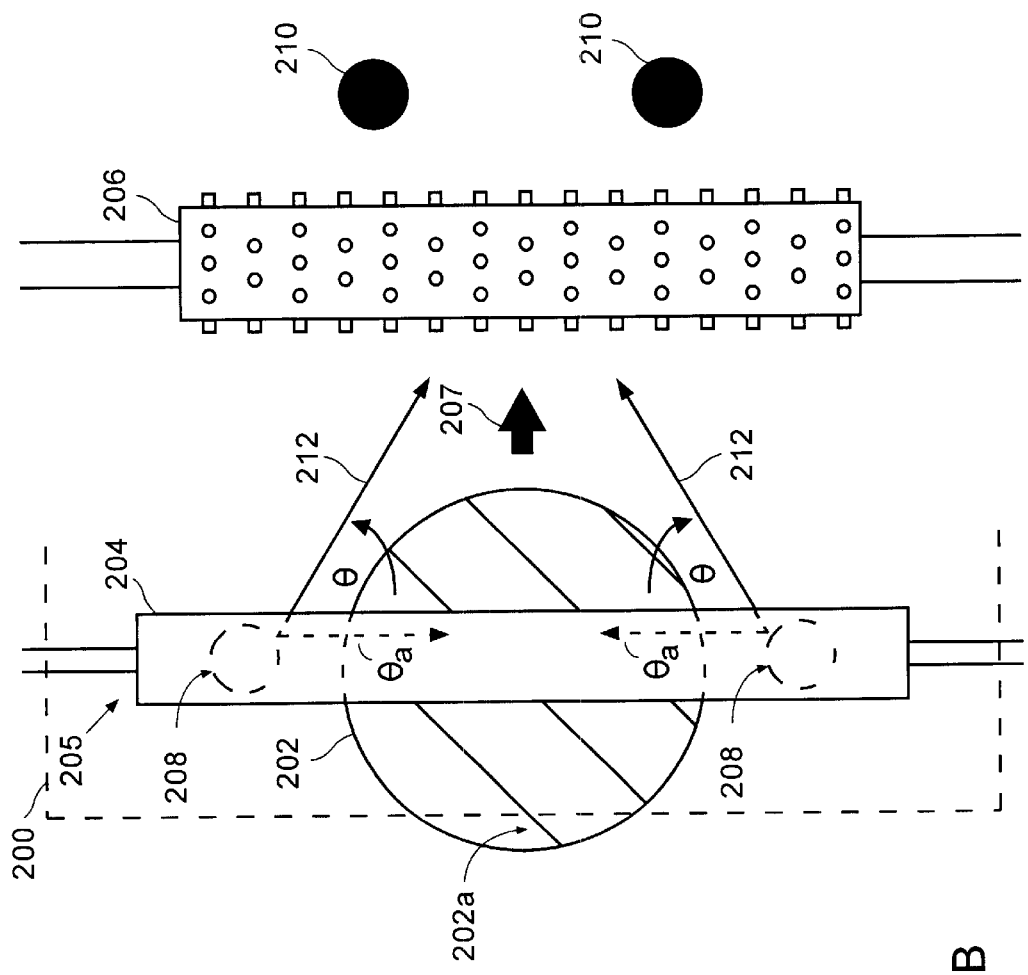
FIG. 2B shows the cleaning system of FIG. 2A, where the wafer is passing under the spraying apparatus, in accordance with one embodiment of the present invention.

FIG. 2B shows the cleaning system of FIG. 2A, where the wafer 202 is passing under the spraying apparatus 205, in accordance with one embodiment of the present invention. The wafer 202 is moved in the transfer direction 207 across the brush box 200. The wafer 202 is sprayed by the liquid 212 as the wafer is beginning to pass under the spraying apparatus 205. It should be noted that the actual separation of the nozzles 208 and the fan angle θ can be varied. Variations are sometimes needed to fully cover the surface of a wafer 202, especially when different size wafers are used, such as, 6 inch wafers, 8 inch wafers, etc.

Figure 2C:
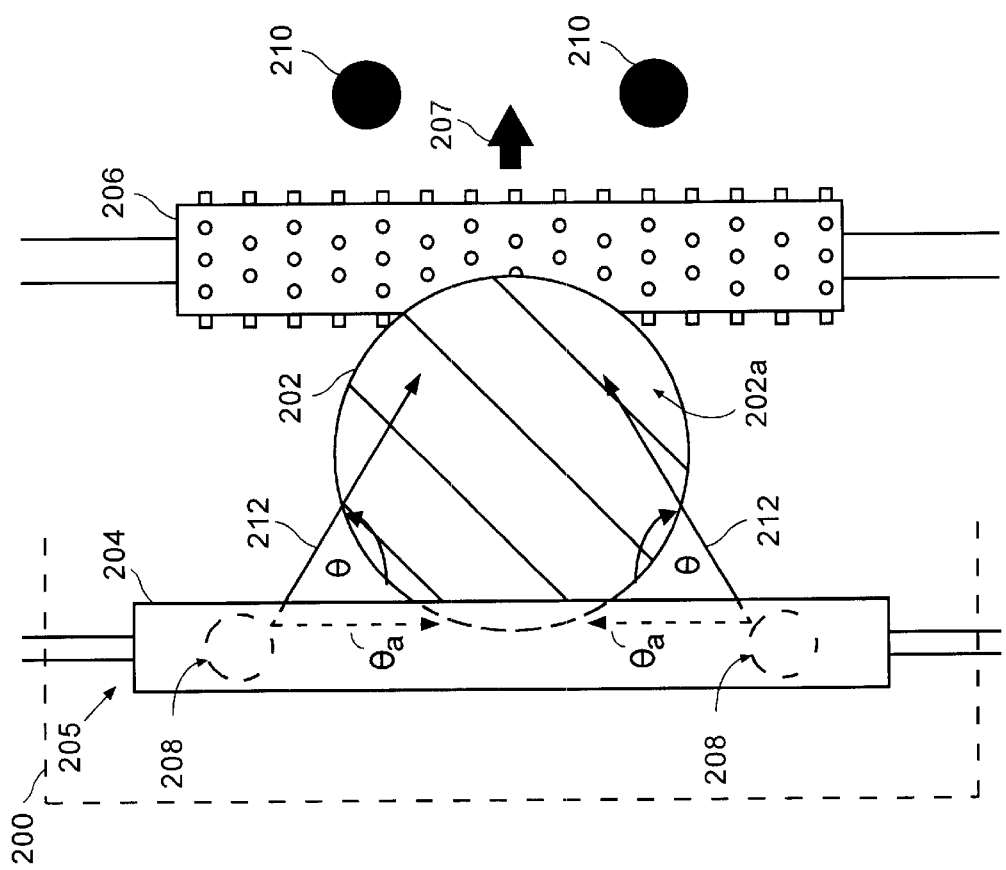
FIG. 2C shows the cleaning system of FIG. 2A, where the wafer is passing under the spraying apparatus and beginning to pass over the cleaning brush, in accordance with one embodiment of the present invention.

FIG. 2C shows the cleaning system of FIG. 2A, where the wafer 202 is passing under the spraying apparatus 205 and beginning to pass over the cleaning brush 206, in accordance with one embodiment of the present invention. The wafer 202 is moved in the transfer direction 207 across the brush box 200. The wafer 202 is still being sprayed by the liquid 212 as the wafer has substantially passed under the spraying apparatus 205.

Figure 2D:
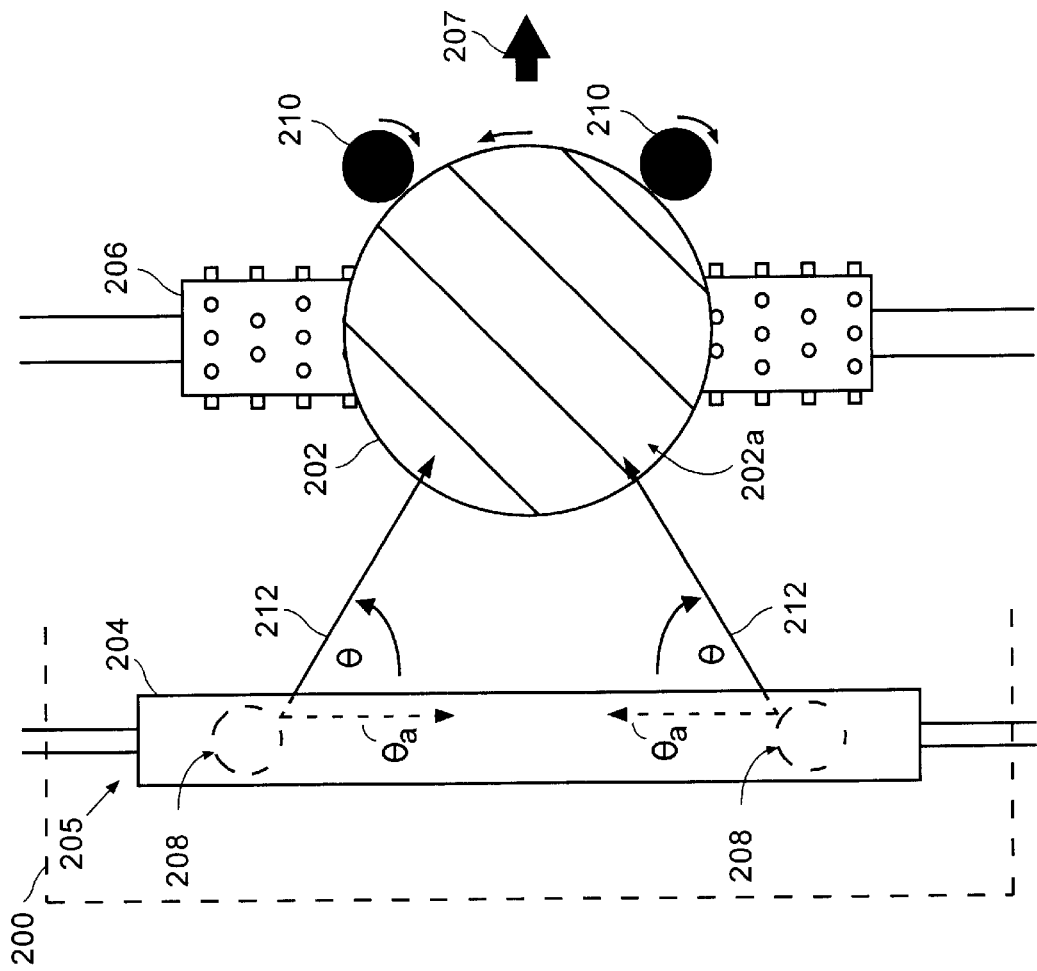
FIG. 2D shows the cleaning system of FIG. 2A, where the wafer has passed under the spraying apparatus, is sitting on top of the cleaning brush, and is abutting the wafer rollers, in accordance with one embodiment of the present invention.

FIG. 2D shows the cleaning system of FIG. 2A, where the wafer 202 has passed under the spraying apparatus 205, is sitting on top of the cleaning brush 206, and is abutting the wafer rollers 210, in accordance with one embodiment of the present invention. At this point, the liquid spraying operation of the spraying apparatus 205 is substantially complete. Using the fluid application technique of FIG. 2, the wafer is adequately prepared for scrubbing by the cleaning brush 206 as the wafer 202 is rotated by the wafer rollers 210.

It should be noted that the above discussion of FIG. 2 involves the disclosure of a brush box 200 having one cleaning brush 206 for scrubbing the bottom surface of the wafer 202. Other embodiments of the present invention may involve more cleaning brushes 206, for example, one for scrubbing the top surface and one for scrubbing the bottom surface of the wafer 202. The top brush is not shown herein to facilitate illustration.

Regarding the characteristics of the cleaning brush 206, the brush box 200 preferably includes a set of PVA brushes that are very soft and porous. The brushes are thereby capable of scrubbing the wafer without damaging the wafer's delicate surface. Because the brushes are porous, they are also able to function as a conduit for fluids that are to be applied to the wafer surface during cleaning. These cleaning operations typically implement chemicals as well as deionized (DI) water. For more information on wafer cleaning systems and techniques, reference may be made to commonly owned U.S. patent application Ser. Nos. (1) 08/792,093, filed Jan. 31, 1997, entitled "Method And Apparatus For Cleaning Of Semiconductor Substrates Using Standard Clean 1 (SCI)," and (2) 08/542,531, filed Oct. 13, 1995, entitled "Method and Apparatus for Chemical Delivery Through the Brush." Both U.S. patent applications are hereby incorporated by reference.

Figure 3:
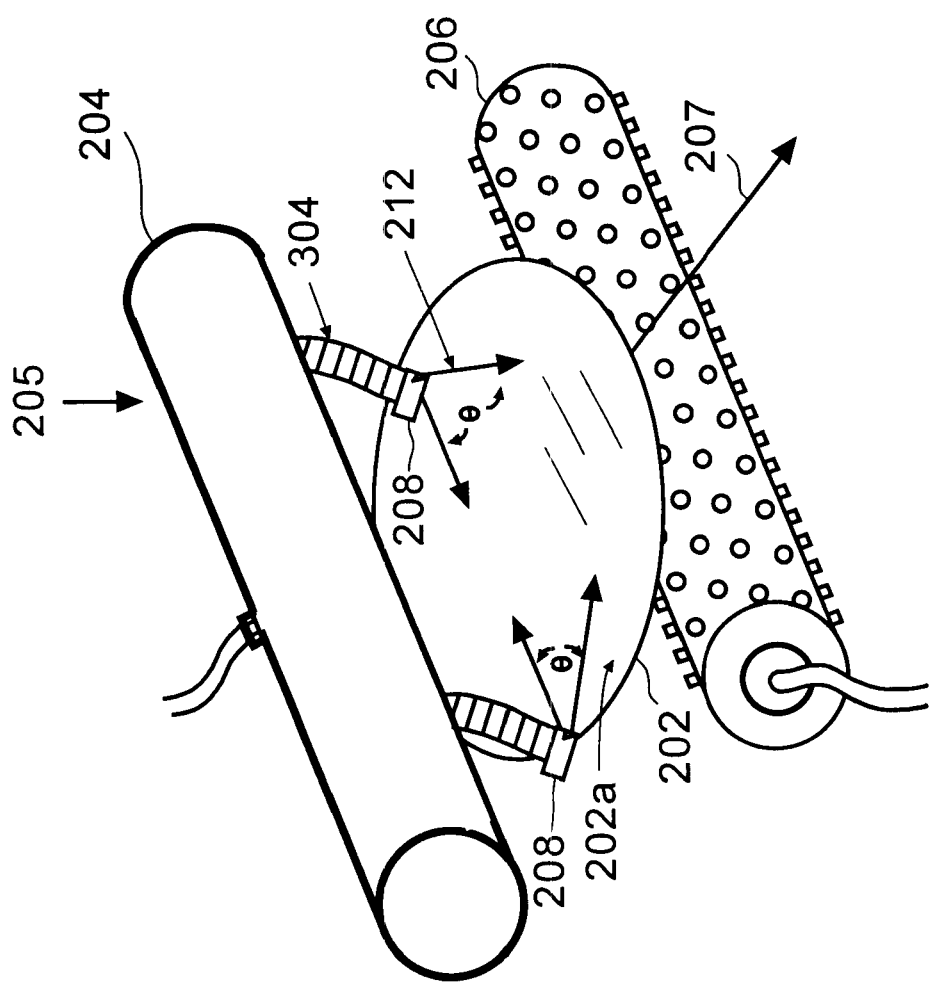
FIG. 3 shows a three dimensional view of the cleaning system of FIG. 2, where the wafer is passing under the spraying apparatus and beginning to pass over the cleaning brush, in accordance with one embodiment of the present invention.

FIG. 3 shows a three dimensional view of the cleaning system of FIG. 2, where the wafer 202 is passing under the spraying apparatus 205 and beginning to pass over the cleaning brush 206, in accordance with one embodiment of the present invention. Note that the position and the transfer direction 207 of the wafer 202 are the same as those discussed above with reference to FIG. 2C. Here, FIG. 3 is showing a different viewing angle in order to further illustrate the mechanical features of the spraying apparatus 205, which includes the fluid manifold 204, flexible conduits 304, and nozzles 208.

Two flexible conduits 304 extend substantially vertically downward from the bottom portion of the fluid manifold 204. The distal end of each flexible conduit 304 is connected to a nozzle 208. The liquid 212 is supplied to the fluid manifold 204 and passes through the flexible conduits 304 to the nozzles 208. As discussed above with reference to FIG. 2, the nozzles 208 spray liquid onto the wafer surface 202a as the wafer 202 passes under the fluid manifold 204.

Figure 4:
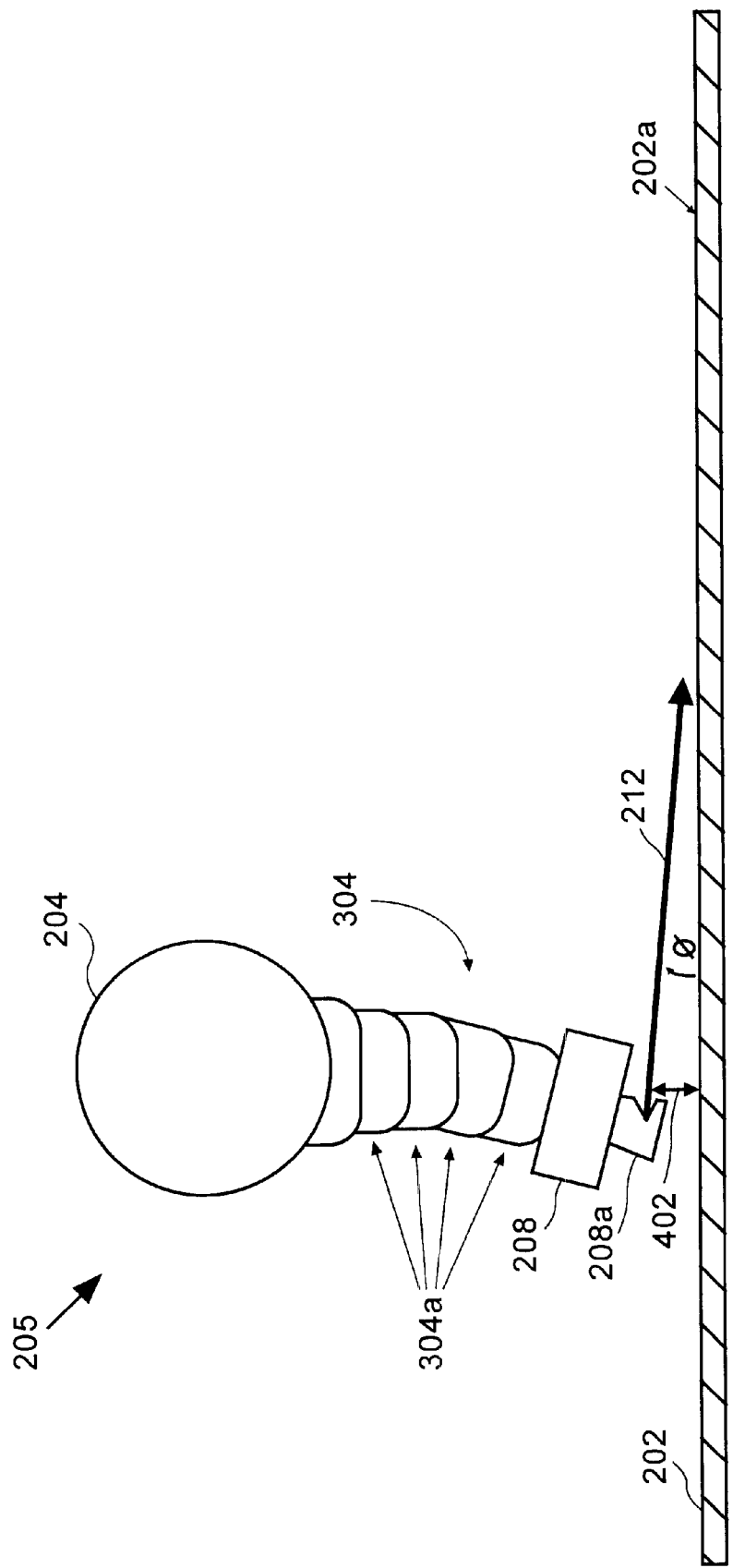
FIG. 4 shows in more detail the spraying apparatus of FIGS. 2 and 3.

FIG. 4 shows in more detail the spraying apparatus 205 of FIGS. 2 and 3. The spraying apparatus 205 includes at least the fluid manifold 204, a nozzle 208, and a flexible conduit 304. The flexible conduit 304 includes links 304a that provide flexibility to the flexible conduit 304. Such flexibility allows for controlled adjustments in the positioning of the nozzle 208 with respect to the wafer surface 202a. Once an adjustment is made to the flexible conduit 304, the links 304a will hold the set position until adjusted again in later use.

The position of the nozzle is defined by at least two parameters, the nozzle height 402 and the application angle φ. The nozzle height 402 is the distance between the surface of the wafer and the location where the liquid 212 exits from the nozzle 208. The application angle φ is the angle formed between the wafer surface and a fan of liquid 212 spraying from the nozzle 208. The nozzle height 402 may be adjusted by removing or adding links 304a to the flexible conduit 304. The nozzle height 402 may also be adjusted by flexing the flexible conduit 304 to a desired flexed position. The application angle φ may be adjusted by flexing the flexible conduit 304 to a desired flexed position.

The nozzle height 402 is preferably between about 5 mm and about 40 mm, and most preferably about 20 mm. The application angle φ is preferably between about 2 degrees and about 80 degrees, and most preferably about 5 degrees. Regardless of the selected positioning of the nozzle, however, the nozzle is positioned such that a fan of liquid 212 may be sprayed onto the wafer surface 202a in a quiescent and symmetrical manner.

Figure 5:
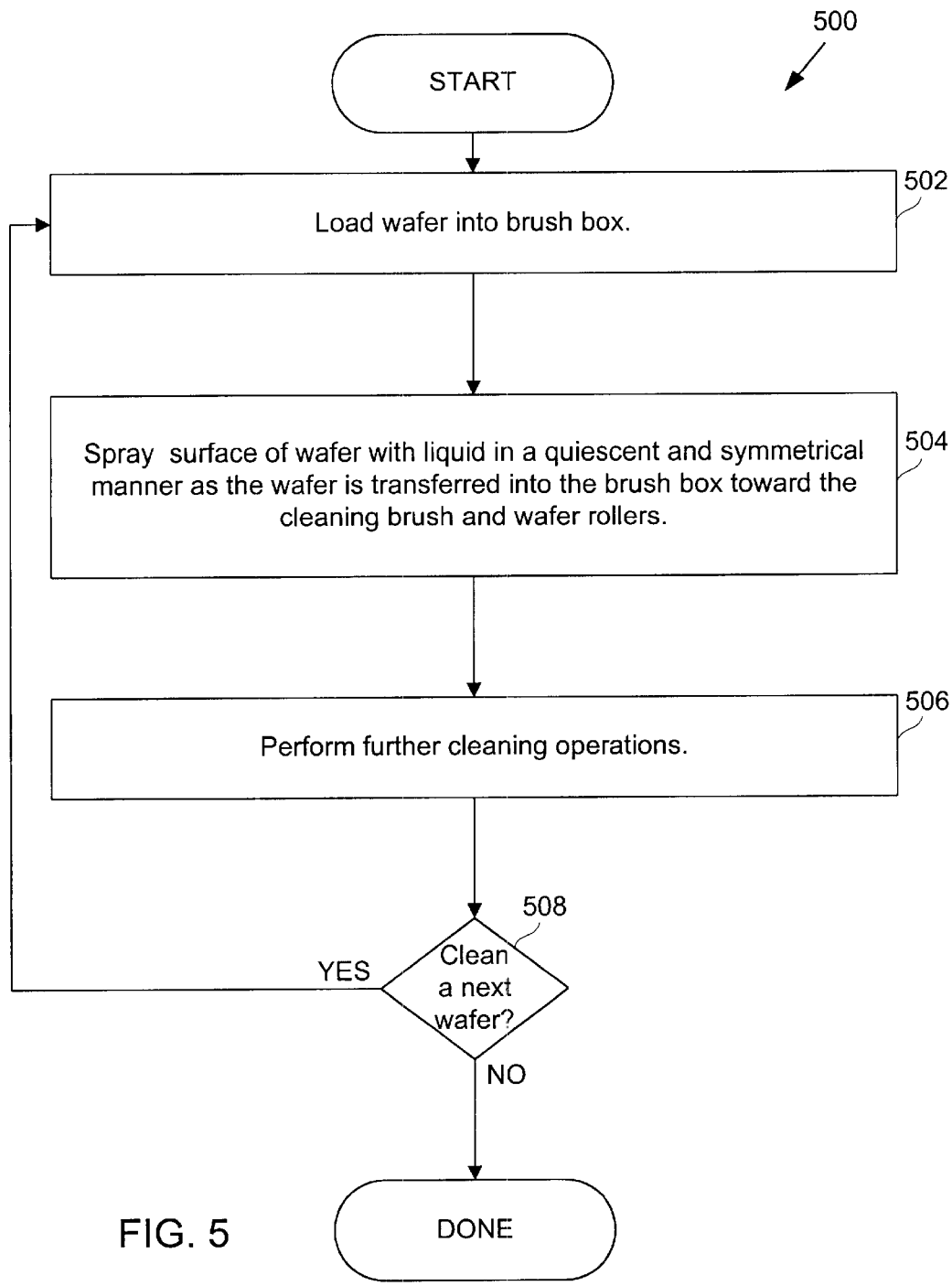
FIG. 5 shows a flow chart for a wafer cleaning method, according to one embodiment of the present invention.

FIG. 5 shows a flow chart for a wafer cleaning method 500, according to one embodiment of the present invention. The method starts in operation 502 where a semiconductor wafer is loaded into a brush box. The method then moves to operation 504, where the wafer surface 202a is sprayed with liquid in a quiescent and symmetrical manner as the wafer is transferred into the brush box toward the cleaning brush and wafer rollers. A preferred embodiment for applying the liquid over the surface of the wafer is discussed in more detail above with reference to FIGS. 2–4.

Next, the method moves the operation 506 where further cleaning operations are performed on the wafer 202. The further cleaning operations may include, for example, scrubbing the wafer surface with cleaning brushes. The method then moves to a decision operation 508 where it is determined whether a next wafer is to be cleaned. If there is no next wafer, then the method is done. On the other hand, if a next wafer is to be cleaned, the method moves to operation 502, where a next wafer is loaded into the brush box. The foregoing cycle continues until there is no next wafer in decision operation 508.

It is important to note that once the wafer is sprayed using the spraying technique of the spraying apparatus, any subsequent contact with water or chemicals will no longer cause the unwanted staining or damage discussed with reference to the prior art.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A system for cleaning a surface of a wafer following a fabrication operation, comprising:
    a brush box, the brush box including:
        a fluid manifold;
        a nozzle connected to the fluid manifold by a flexible conduit, the nozzle being configured to spray a liquid onto the surface of the wafer at a fan angle and an application angle, the application angle being defined between a plane of the surface of the wafer and a spraying plane of the liquid, the application angle being adjusted between about 2 degrees and about 80 degrees, the fan angle being adjusted between about 10 degrees and about 120 degrees, and wherein the fan angle and the application angle are configured such that the sprayed liquid covers the surface of the wafer in a quiescent manner.

2. A system for cleaning a surface of a wafer following a fabrication operation as recited in claim 1, wherein the fluid manifold is positioned over a wafer transfer path within the brush box.

3. A system for cleaning a surface of a wafer following a fabrication operation as recited in claim 2, wherein the nozzle is positioned above the surface of the wafer at a nozzle height, the nozzle height being adjustable by way of the flexible conduit.

4. A system for cleaning a surface of a wafer following a fabrication operation as recited in claim 3, wherein the nozzle height is adjusted to be between about 5 mm and about 40 mm.

5. A system for cleaning a surface of a wafer following a fabrication operation as recited in claim 2, wherein the application angle is adjustable by way of the flexible conduit.

6. A system for cleaning a surface of a wafer following a fabrication operation as recited in claim 5, wherein the application angle is about 5 degrees.

7. A system for cleaning a surface of a wafer following a fabrication operation as recited in claim 2, wherein the fan angle is about 60 degrees.

8. A system for cleaning a surface of a wafer following a fabrication operation as recited in claim 1, further comprising:
    a second nozzle connected to the fluid manifold by a second flexible conduit, the second nozzle being configured to spray the liquid onto the surface of the wafer at a second application angle, wherein the second nozzle is further configured to spray the liquid onto the surface of the wafer at a second fan angle.

9. A system for cleaning a surface of a wafer following a fabrication operation as recited in claim 8, wherein a first angle starting reference of the first fan angle is aligned with the liquid manifold, and a second angle starting reference of the second fan angle is likewise aligned with the liquid manifold.

10. A system for cleaning a surface of a wafer following a fabrication operation as recited in claim 9, wherein the sprayed liquid having the fan angle delivered by the nozzle and the second fan angle delivered by second nozzle overlaps to symmetrically spray the surface of the wafer.

11. A wafer spraying apparatus, comprising:
    a manifold for delivering a flow of liquid, the manifold being disposed over a wafer transfer path within the brush box;
    first and second flexible conduits connected to the manifold; and
    a first nozzle connected to a distal end of the first flexible conduit, the first nozzle being positioned above a surface of a wafer at a nozzle height between about 5 mm and about 20 mm; and
    a second nozzle connected to a distal end of the second flexible conduit, the second nozzle being positioned above a surface of a wafer at a nozzle height between about 5 mm and about 20 mm, wherein the first and second flexible conduits are configured to transport the flow of liquid from the manifold to the first and second nozzles, respectively, each of the first and second nozzles is configured to spray a fan of the flow of liquid onto the surface of the wafer, and each of the fans of the flow of liquid is applied at an application angle between about 2 degrees and about 80 degrees, the application angle being defined between a plane of the fan of the flow of liquid and a surface of the wafer that is configured to receive the flow of liquid from the nozzle.

12. A wafer spraying apparatus as recited in claim 11, wherein the nozzle is positioned above the surface of the wafer at a nozzle height, the nozzle height being adjustable by way of the flexible conduit.

13. A wafer spraying apparatus as recited in claim 12, wherein a first angle starting reference of a first fan angle is aligned with the manifold, and a second angle starting reference of a second fan angle is likewise aligned with the manifold.

14. A wafer spraying apparatus as recited in claim 11, wherein the application angle is adjustable by way of the flexible conduit.

15. A wafer spraying apparatus as recited in claim 14, wherein the application angle is adjusted to be between about 2 degrees and about 80 degrees.

16. A wafer spraying apparatus as recited in claim 11, wherein the fan angle is configured to be between about 10 degrees and about 120 degrees.

17. A wafer spraying apparatus as recited in claim 11, wherein the nozzle is further configured to spray the fan of the flow of liquid onto the surface of the wafer with substantially no splashing.

\* \* \* \* \*